United States Patent [19]
Takayama et al.

[11] Patent Number: 5,843,225
[45] Date of Patent: Dec. 1, 1998

[54] PROCESS FOR FABRICATING SEMICONDUCTOR AND PROCESS FOR FABRICATING SEMICONDUCTOR DEVICE

[75] Inventors: Toru Takayama, Kanagawa; Yasuhiko Takemura, Shiga; Hongyong Zhang, Kanagawa; Shunpei Yamazaki, Tokyo, all of Japan

[73] Assignee: Semiconductor Energy Laboratory Co., Ltd., Kanagawa, Japan

[21] Appl. No.: 479,720

[22] Filed: Jun. 7, 1995

Related U.S. Application Data

[63] Continuation-in-part of Ser. No. 189,658, Feb. 1, 1994.

[30] Foreign Application Priority Data

Feb. 3, 1993 [JP] Japan ..................................... 5-39499

[51] Int. Cl.$^6$ ....................................................... C30B 1/10
[52] U.S. Cl. .................................... 117/8; 117/9; 117/930
[58] Field of Search ..................................... 117/8, 9, 930

[56] References Cited

U.S. PATENT DOCUMENTS

| | | | |
|---|---|---|---|
| Re. 28,385 | 4/1975 | Mayer | 437/13 |
| Re. 28,386 | 4/1975 | Heiman et al. | 437/13 |
| 3,783,049 | 1/1974 | Sandera | 437/142 |
| 4,231,809 | 11/1980 | Schmidt | 437/13 |
| 4,561,171 | 12/1985 | Schlosser . | |
| 5,010,037 | 4/1991 | Lin et al. | 117/930 |
| 5,037,774 | 8/1991 | Yamawaki et al. | 117/930 |
| 5,075,259 | 12/1991 | Moran | 437/230 |
| 5,147,826 | 9/1992 | Liu et al. . | |
| 5,225,355 | 7/1993 | Sugino et al. | 437/13 |
| 5,244,819 | 9/1993 | Yue | 437/11 |
| 5,264,383 | 11/1993 | Young | 437/40 TFT |
| 5,275,851 | 1/1994 | Fonash et al. . | |
| 5,298,075 | 3/1994 | Lagendijk et al. | 134/2 |
| 5,300,187 | 4/1994 | Lesk et al. | 437/13 |
| 5,352,291 | 10/1994 | Zhang et al. | 117/8 |
| 5,422,311 | 6/1995 | Woo | 437/967 |
| 5,426,061 | 6/1995 | Sopori . | |

FOREIGN PATENT DOCUMENTS

| | | | |
|---|---|---|---|
| 85406 | 8/1983 | European Pat. Off. | 117/9 |
| 58-33822 | 2/1983 | Japan | 117/9 |
| 58-190020 | 11/1983 | Japan | 117/930 |
| 59-83993 | 5/1984 | Japan | 117/8 |
| 62-33417 | 2/1987 | Japan | 117/930 |
| 2140915 | 5/1990 | Japan | 437/21 |
| 5-58789 | 3/1993 | Japan | 117/930 |
| 5109737 | 4/1993 | Japan . | |
| 5-335335 | 12/1993 | Japan . | |

OTHER PUBLICATIONS

R. Kakkad et al., "Crystallized Si Films by Low–temperature rapid thermal annealing of amorphous silicon," *J. Appl. Phys.*, 65(5), Mar. 1, 1989, pp. 2069–2072.

G. Liu et al., "Polycrystalline silicon thin film transistors on Corning 7059 glass substrates using short time, Low–temperature processing," *Appl. Phys. Lett.* 62(20), May 17, 1993, pp. 2554–2556.

(List continued on next page.)

*Primary Examiner*—Robert Kunemund
*Attorney, Agent, or Firm*—Sixbey, Friedman, Leedom & Ferguson, P.C.; Gerald J. Ferguson, Jr.; Jeffrey L. Costellia

[57] ABSTRACT

A process for fabricating a semiconductor at a lower crystallization temperature and yet at a shorter period of time, which comprises forming an insulator coating on a substrate; exposing said insulator coating to a plasma; forming an amorphous silicon film on said insulator coating after its exposure to said plasma; and heat treating said silicon film in the temperature range of from 400° to 650° C. or at a temperature not higher than the glass transition temperature of the substrate. The nucleation sites are controlled by selectively exposing the amorphous silicon film to a plasma or by selectively applying a substance containing elements having a catalytic effect thereto. A process for fabricating a thin film transistor using the same is also disclosed.

67 Claims, 8 Drawing Sheets

OTHER PUBLICATIONS

G. Liu et al., "Selective area crystallization of amorphous silicon films by Low–temperature rapid thermal annealing," *Appl. Phys. Lett.* 55(7), Aug. 14, 1989, pp. 660–662.

R. Kakkad et al., "Low Temperature Selective Crystallization of Amorphous Silicon," *Journal of Non–Crystalline Solids*, 115, 1989, pp. 66–68.

S. Wolf, "Silicon Processing for VLSI ERA" vol. II, pp. 144–146, Jun., 1990.

S.–W. Lee, et al. *Appl. Phys.Lett.*, 66(13)(1995) 1672, "Pd Induced Lateral Crystallization of a–Si . . .", Mar. 1995.

S. Caune et al., Appl. Surf. Sci., 36(1989) 597 "Combined CW Laser and furnace annealing of a–Si . . . in contact with some metals", 1989.

J.M.Green et al., IBM Tech. Discl. Bulletin, 16(5) (1973) 1612, "Method to purify semiconductor wafers", Oct. 1973.

S.–W. Lee, et al., AM–LCD '95 Proceedings, Page 113, ". . . TFT . . .by Ni Induced Lateral Crystallization of a–Si . . .", Aug., 1995.

S.F. Gong, et al., *J. Appl. Phys.*, 68(9)(1990)(4542), ". . . Solid State Si–Metal Interactions . . .", Nov., 1990.

P. H. Robinson et al., "Use of HCL Gettering in Silicon Device Processing," J. Electrochem. Soc. V. 118, No. 1, pp. 141–143, Jan. 1971.

Kawazu et al., "Low Temperature Crystallization of Hydrogenated Amorphous Silicon Induced by Nickel Silicide Formation", Jap. Journal of Applied Physics, vol. 29, No. 12, Dec. 1990, pp. 2698–2704.

Fortuna et al., In Situ Study of Ion Beam Induced Si Crystallization From a Silicide Interface, Applied Surface Science 73 (1993) pp. 264–267.

C. Hayzelden et al., "*In Situ* Transmission Electron Microscopy Studies of Silicide–Mediated Crystallization of Amorphous Silicon" (3 pages).

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

T. Hempel et al., "Needle–Like Crystallization of Ni Doped Amorphous Silicon Thin Films", *Solid State Communications*, vol. 85, No. 11, pp. 921–924, 1993.

Carter et al., Ion Implantation of Semiconductors, John Wiley & Sons, New York, pp. 172–173, 1976.

5,843,225

PROCESS FOR FABRICATING SEMICONDUCTOR AND PROCESS FOR FABRICATING SEMICONDUCTOR DEVICE

This is a Continuation in Part application of Ser. No. 08/189,658 filed on Feb. 1, 1994 pending.

BACKGROUND OF THE INVENTION

1. Field of the Invention

The present invention relates to a process for fabricating a crystalline semiconductor for use in thin film devices such as thin-film insulated-gate field-effect transistors (hereinafter referred to simply as "thin film transistors" or "TFTs"). The present invention also relates to a process for fabricating a semiconductor device using the same.

2. Prior Art

Thin films of crystalline silicon semiconductor for use in thin film devices such as TFTs known heretofore have been fabricated by crystallizing an amorphous silicon film formed through plasma CVD (chemical vapor deposition) or thermal CVD, using an apparatus such as an electric furnace maintained at a temperature of not lower than 600° C. for a duration of 12 hours or longer. Thin films of crystalline silicon semiconductor having sufficiently high quality (for example, an excellent field effect and a high reliability) are available only after subjecting the amorphous film to a heat treatment for a still longer duration.

However, those prior art processes for obtaining thin films of crystalline silicon semiconductor suffer various problems yet to be solved. One of the problems is the low throughput which increases the process cost. For instance, if a duration of 24 hours is required for the crystallization step. 720 substrates must be processed at a time considering that preferably, the substrates each consume 2 minutes of process time. However, the maximum number of substrates an ordinary tubular furnace can treat at a time is limited to 50; in a practical treatment using only one apparatus (reaction tube), it has been found that a single substrate consumes 30 minutes to complete the treatment. In other words, at least 15 reaction tubes are necessary to complete the reaction per single substrate in 2 minutes. This signifies an increase in investment cost and therefore an increase of the product price due to a too large depreciation for the investment.

The temperature of the heat treatment is another problem to be considered. In general, a TFT is fabricated using a quartz glass substrate comprising pure silicon oxide or an alkali-free borosilicate glass substrate such as the #7059 glass substrate manufactured by Corning Incorporated (hereinafter referred to simply as "Corning #7059 substrate"). The former substrate has such an excellent heat resistance that it can be treated in the same manner as in a conventional wafer process for semiconductor integrated circuits. However, it is expensive, and, moreover, the price increases exponentially with increasing the area of the substrate. Thus, at present, the use of quartz glass substrates is limited to TFT integrated circuits having a relatively small area.

On the other hand, alkali-free borosilicate glass substrates are inexpensive as compared to those made of quartz glass, however, they have shortcomings with respect to their heat resistance. Since an alkali-free glass substrate undergoes deformation at a temperature in the range of from 550° to 650° C., and more particularly, since a readily available material initiates its deformation at a temperature not higher than 600° C., any heat treatment at 600° C. causes an irreversible shrinkage and warping to form on the substrate. These deformations appear particularly distinctly on a substrate having a diagonal length of more than 10 inches. Accordingly, it is believed requisite to perform the heat treatment on a silicon semiconductor film at a temperature of 550° C. or lower and for a duration of within 4 hours to reduce the entire process cost.

SUMMARY OF THE INVENTION

In the light of the aforementioned circumstances, an object of the present invention is to provide a process for fabricating a semiconductor which can resist to a heat treatment conducted under the above conditions, and to provide a process for fabricating a semiconductor device using such semiconductors.

An embodiment according to the present invention provides a process for fabricating a semiconductor, which is characterized in that it comprises forming an insulator coating on a substrate; exposing said insulator coating to a plasma; forming an amorphous silicon film on said insulator coating after its exposure to said plasma; and crystallizing said silicon film by photo annealing said silicon film and/or heat treating said silicon film in the temperature range of from 400° to 650° C. or at a temperature not higher than the glass transition temperature of the substrate.

Another embodiment according to the present invention provides a process for fabricating a semiconductor, which is characterized in that it comprises forming an insulator coating on a substrate; selectively coating said insulator film with a masking material; exposing said substrate to a plasma; forming an amorphous silicon film on said insulator coating after exposing the substrate to said plasma; crystallizing said silicon film by photo annealing said silicon film and/or heat treating said silicon film in the temperature range of from 400° to 650° C. or at a temperature not higher than the glass transition temperature of the substrate; and selectively etching said silicon film.

Furthermore, still another embodiment according to the present invention comprises fabricating a thin film transistor which is characterized in that it comprises forming an insulator coating on a substrate; selectively coating said insulator coating with a masking material; exposing said substrate to a plasma; forming an amorphous silicon film on said insulator coating after exposing the substrate to said plasma; crystallizing said silicon film by photo annealing said silicon film and/or heat treating said silicon film in the temperature range of from 400° to 650° C. or at a temperature not higher than the glass transition temperature of the substrate; selectively etching said silicon film; and establishing a channel forming region of a thin film transistor from the portion previously coated with the masking material.

Yet another embodiment according to the present invention provides a process for fabricating a semiconductor, which is characterized in that it comprises forming an amorphous silicon film on a substrate; forming, in intimate contact with the upper or the lower surface of said silicon film, a substance comprising an element which accelerates the crystallization of amorphous silicon by exerting a catalytic effect thereto; and crystallizing the silicon film by photo annealing the silicon film and/or heating the silicon film in the temperature range of from 400° to 650° C. or at a temperature not higher than the glass transition temperature of the substrate. More specifically, the present process is accomplished by coating the surface of a base coating of the amorphous film with a solution containing water, an alcohol (either monohydric or polyhydric), a petroleum solvent (which may be a saturated or an unsaturated hydrocarbon), and the like, dissolved or dispersed therein an acetate or a nitrate, any type of carboxylate, or any other organic acid salt of an element which accelerates the crystallization. The coating may be otherwise provided on the upper surface of the amorphous coating film. The resulting amorphous coating is then subjected to heat treatment.

Still another embodiment according to the present invention provides a process for fabricating a semiconductor, characterized in that it comprises forming an insulator coating on a substrate; selectively coating said insulator coating with a masking material; exposing said substrate to a plasma or forming a coating of a substance containing an element which has a catalytic effect and accelerates the crystallization of the amorphous silicon; forming an amorphous silicon film on said insulator coating after subjecting the substrate to said previous stop; crystallizing said silicon film by photo annealing said silicon film and/or heat treating said silicon film in the temperature range of from 400° to 650° C. or at a temperature not higher than the glass transition temperature of the substrate; and selectively etching said silicon film.

DETAILED DESCRIPTION OF THE INVENTION

Figure 1:
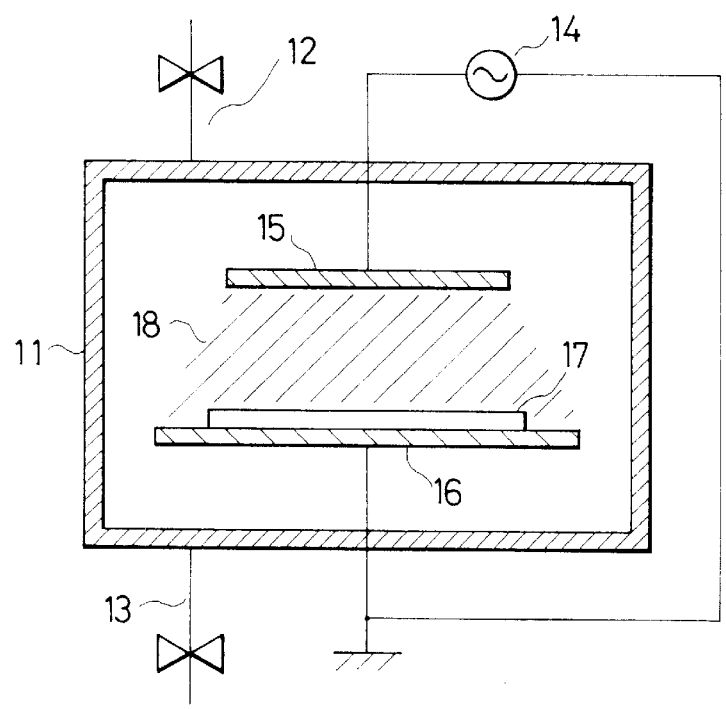
FIG. 1 shows a schematic view of an apparatus for performing a process according to an embodiment of the present invention (see Example 1)

After an extensive study, the present inventors have found a means for overcoming the aforementioned problems. More specifically, the present inventors formed a lower insulator layer on a substrate to prevent impurities from intruding into the semiconductor layer from the substrate, and, after once exposing the insulator layer to plasma, deposited a layer of amorphous silicon and optically and/or thermally crystallized the amorphous silicon. Thus, it has been found that a silicon semiconductor film deposited on the resulting structure can be crystallized considerably easily.

The aforementioned findings can be explained as follows. The reason why a conventional thermal crystallization process at about 600° C. requires a long period of time can be explained, in one aspect, by the generation of crystal nuclei which takes a long time. In the present specification, this period of time is referred to as a latent period. According to the 24-hour observation of a crystallization process by the present inventors, silicon maintains its initial amorphous state in the initial period of six hours because no nucleus is formed during this period. In the subsequent period of six hours, nuclei are generated spontaneously, and this step is followed by the crystallization. It can be seen that a prior art process includes a latent period for a duration of from 6 to 12 hours in the entire process time. However, the nuclei thus formed during the latent period are highly disordered, and the concentration of the nuclei differs from a place to place. Thus, in particular regions, it happens that the crystallization greatly proceeds; but in other regions, substantially no crystallization is observed to occur. However, with passage of time, nucleation occurs also in those regions in which no nucleation had been observed, or the region of crystallization extends to gradually cover the entire substrate. It can be seen that a period of 12 hours or longer is necessary to obtain a completely crystallized substrate.

When the base insulator film is treated with a plasma, a substance which functions as a catalyst for accelerating the crystallization is formed in the insulator film. A catalyst which accelerates the nucleation signifies, for example, a charge or a defect which results from the damage caused by the plasma, or a deposit from a material which constitutes the chamber or the substrate. More specifically, those from materials having a catalytic effect on crystallization, such as nickel, iron, cobalt, and platinum, are found to have marked effects as catalysts. The presence of these catalysts facilitates nucleation and shortens the latent period. Moreover, a larger number of crystal nuclei can be obtained by increasing the amount of these catalysts. This can be assumed by the fact that a longer plasma treatment allows nucleation to occur at a higher density and that it leads to the generation of finer crystals.

Another aspect to be noticed in the plasma treatment is that the nucleation occurs in an extremely uniform density over the entire substrate. This can be confirmed by observing the lightly etched surface of a silicon film crystallized by the present invention. More specifically, the surface of a specimen obtained by depositing an amorphous silicon film on a plasma-treated substrate and thermally treating the resulting structure at 550° C. for a duration of 4 hours is observed under an optical microscope, electron microscope, and the like after lightly etching the surface using a fluoronitric acid. Then, it can be found that carter-like minute holes are formed at approximately the same spacing. These holes are believed attributable to the presence of materials liable to be readily etched. In other words, the etched pattern corresponds to the density distribution of crystal nuclei inside the silicon film. It can be assumed that the catalyst is distributed in the same manner as the density distribution pattern of the holes. In the process according to the present invention, a preferred nickel concentration is in the range of from $1 \times 10^{15}$ atoms·cm$^{-3}$ to 1% by atomic, and more preferably, the nickel concentration is in the range of from $1\times10^{16}$ atoms·cm$^{-3}$ to 0.001% by atomic. Most preferably, the minimum concentration is in the range of from $1\times10^{15}$ to $1\times10^{17}$ atoms·cm$^{-3}$ as observed by SIMS (secondary ion mass spectrometer). If the nickel concentration exceeds the above value, the characteristics of the resulting semiconductor would be greatly impaired. On the other hand, if the nickel concentration should fall lower than the defined range, no crystallization proceeds at a temperature of 590° C. or lower.

Favorable results on the plasma treatment can be obtained by performing the treatment using a parallel-plate type plasma generation apparatus. Otherwise, the use of a positive column discharge in a chamber while applying a proper bias can also yield favorable results. At any rate, preferred results can be obtained by using an electrode made of nickel, iron, or cobalt for generating the plasma.

Furthermore, the crystallization occurs more easily by heating the substrate to a temperature range of from 100° C. to 500° C. during the plasma treatment, and more specifically, the substrate is preferably heated to a temperature of 200° C. or higher. This is because the catalytic substance can be more readily obtained at higher temperatures.

Best results on plasma treatment can be obtained by generating the plasma in an atmosphere containing nitrogen, oxygen, argon, neon, or krypton, and particularly, when these gases are contained in an amount of 10 volume by % or more. The gas is preferably diluted using hydrogen or helium. Moreover, the silicon films which yield the best results were found to be intrinsic or substantially intrinsic, and they were found to contain the foreign elements carbon, oxygen, and nitrogen each at a concentration of $1\times10^{19}$ cm$^{-3}$ or lower by SIMS (secondary ion mass spectroscopy).

The process according to the present invention comprises plasma treating the surface of a base insulator film. However, when a substrate once subjected to plasma treatment is exposed to the atmosphere, dust, water, and other impurities adhere to the surface to greatly impair the crystallinity of the silicon film. In other words, substrates having a non-uniform characteristics result by the exposure of the substrate to the atmosphere. Such a problem can be circumvented by performing the film deposition and the plasma treatment in a closed system, and maintaining an environment in which the film deposition can be performed continuously without exposing the plasma-treated substrate to air. Furthermore, preferably, the surface of the substrate and the insulating coating is maintained at a sufficiently clean state. For instance, carbon, organic matter, and the like are preferably removed from the surface by employing ultraviolet irradiation, ozone treatment, or a combination thereof.

The present inventors further extended the study above, and thought of a simple process which comprises applying a substance containing an element capable of accelerating the crystallization or a compound thereof to achieve similar results as those obtained by plasma treating the surface of the insulator coating. By using such a means, the conventional installation can be used as it is without additionally furnishing it with a vacuum apparatus. In the use of such substances, however, it has been feared that oxygen and carbon included in the salt may diffuse into the silicon film and that they may degrade the semiconductor characteristics of the silicon film. Accordingly, the present inventors conducted a study using thermogravimetry and differential thermal analysis to find that, by properly selecting the material, such additional substances decompose to yield oxides or elements at a temperature of 450° C. or lower, and that no further diffusion of such substances occurs to allow them penetrate into the silicon film. In particular, when decomposed under a reducing atmosphere such as nitrogen gas, salts such as acetates and nitrates were found to yield elemental metal at a temperature of 400° C. or lower. These salts yield oxides at first through decomposition in an oxygen atmosphere, but they finally yield elemental metal at higher temperatures upon the desorption of oxygen.

After thus introducing an element which accelerates the crystallization of at least a part of the silicon film, the entire structure was subjected to annealing in the temperature range of from 400° to 650° C. Similar to the foregoing process which comprises applying a plasma treatment, crystallization was found to occur on the amorphous silicon film after the passage of 2 hours.

However, the catalytic elements above, i.e., nickel, iron, cobalt, and platinum themselves are not favorable for silicon. Accordingly, their concentration is preferably suppressed as low as possible. The present inventors have found, through an extensive study, that the concentration of these elements for a semiconductor to be used in a semiconductor device such as a TFT is preferably controlled, from the viewpoint of assuring favorable characteristics and reliability, to be in the range of from $1\times10^{15}$ atoms·cm$^{31\ 3}$ to 1 atom %, and more preferably, in the range of from $1\times10^{16}$ atoms·cm$^{-3}$ to 0.001 atom %. Most preferably, the minimum concentration of the catalytic metal elements is in the range of from $1\times10^{15}$ to $1\times10^{19}$ atoms·cm$^{-3}$ as observed by SIMS (secondary ion mass spectrometer). If the concentration of the catalytic metal elements should fall below this range, sufficient crystallization would not result. If the concentration should exceed this range, on the other hand, semiconductors with poor characteristics and reliability would be obtained.

The present invention is illustrated in greater detail referring to non-limiting examples below. It should be understood, however, that the present invention is not to be construed as being limited thereto.

EXAMPLE 1

A process for crystallizing a planar amorphous silicon film formed on a Corning #7059 substrate is described below. A 2,000 Å thick silicon oxide film was deposited on the substrate as a base film using RF sputtering, and the resulting silicon oxide film was treated in nitrogen plasma. A plasma treating apparatus was of a parallel plane type as shown schematically in FIG. 1. It comprises a chamber 11, a gas inlet system 12, an evacuation system 13, an RF power source 14, and nickel-alloy electrodes 15 and 16, so that the substrate 17 may be placed under an RF plasma 18.

The plasma treatment was performed for a duration of 5 minutes by applying an RF power of 20 W or 60 W under a reaction pressure of 10 Pa (where, a vacuum degree of $10^{-3}$ Pa or lower is achieved), while flowing nitrogen as the reactive gas at a flow rate of 100 SCCM (standard cubic centimeters per minute) and setting the substrate temperature to 200° C.

Then, a 1,500 Å thick amorphous silicon film was deposited by plasma CVD, and after removing hydrogen from the film by keeping it at a temperature of 430° C. for 1 hour, solid phase growth was allowed to take place thereon in the temperature range of from 500° to 580° C. for a duration of from 10 minutes to 8 hours. The solid phase growth may be carried out by irradiating a laser light thereto before or after or at the same time as heating in the above temperature range.

Figure 5:
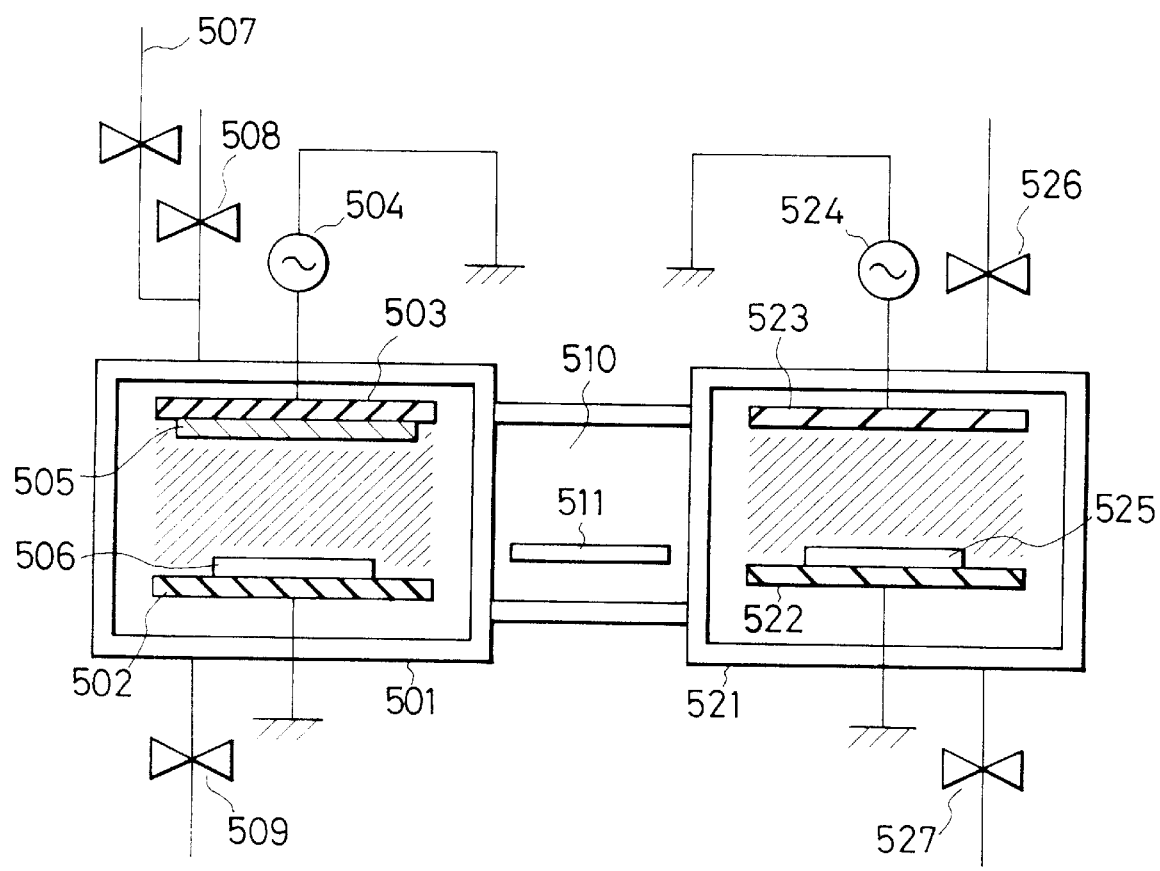
FIG. 5 shows a schematic view of an apparatus for performing a process according to an embodiment of the present invention (see Example 1)

The above steps may be performed otherwise using, for example, an apparatus having two or more chambers as shown in FIG. 5, so that the steps can be performed continuously. Particularly, the above processes comprise depositing the amorphous silicon film after once exposing the plasma-treated silicon oxide base to air. The process according to the present invention is sensitive to the surface conditions, and the characteristics of the resulting crystalline silicon film tend to be greatly influenced by the inclusions which may adhere to the surface of the substrate during its exposure to air.

Referring briefly to the apparatus illustrated in FIG. 5, it comprises a chamber 501 which is a sputtering apparatus, and a plasma is generated by supplying electric power to two electrodes (sample holder and a backing plate) 502 and 503 from an RF power source 504. A substrate 506, which is the sample, and a target 505 are placed on the respective electrodes. The target 505 in this case is silicon oxide. The chamber 501 is further equipped with a gas system 507 for introducing a gas mixture comprising oxygen gas and argon gas, and another gas system 508 for introducing nitrogen gas. Thus, a gas is supplied from the former system during the deposition of the film, and during the plasma treatment, the gas is supplied from the latter system. An evacuation system 509 is also provided to the chamber 501.

The apparatus further comprises a chamber 521 which is a plasma CVD apparatus of a parallel plane type. A plasma can be generated inside the chamber 521 by supplying an electric power from a power source 524 to two electrodes 522 and 523 provided inside the chamber 521. A sample substrate 525 is mounted on the electrode 522 so that a coating which generates by a plasma reaction would form on the substrate upon introducing a gas mixture of silane and hydrogen into the chamber through a gas system 526. Though not shown in the figure, a mechanism is provided to those chambers as such that the substrate can be heated to a proper temperature.

An additional chamber 510, in which a substrate 511 is placed, is provided between the two plasma chambers.

In a process using the apparatus illustrated in FIG. 5, nitrogen plasma treatment is performed immediately after the completion of silicon oxide film deposition using sputtering in the chamber 501, by replacing the atmosphere inside the chamber with nitrogen. If a silicon oxide target should remain inside the chamber, further deposition of silicon oxide film occurs by sputtering. To prevent this from occurring, the RF power must be lowered or the silicon oxide target must be isolated from the plasma. Fortunately, as described hereinafter, plasma treatment is performed optimally at a power of 60 W or lower, and preferably, at a power of 20 W, as compared to an RF power of 100 W or higher required for sputtering. Accordingly, no deposition of silicon oxide occurred during the treatment in nitrogen plasma. To further assure the process, however, a chamber for depositing the silicon oxide film is preferably installed separately from the chamber for use in plasma treatment. An amorphous silicon film thus deposited was also subjected to solid-phase crystallization under the same conditions described hereinbefore.

Figure 6:
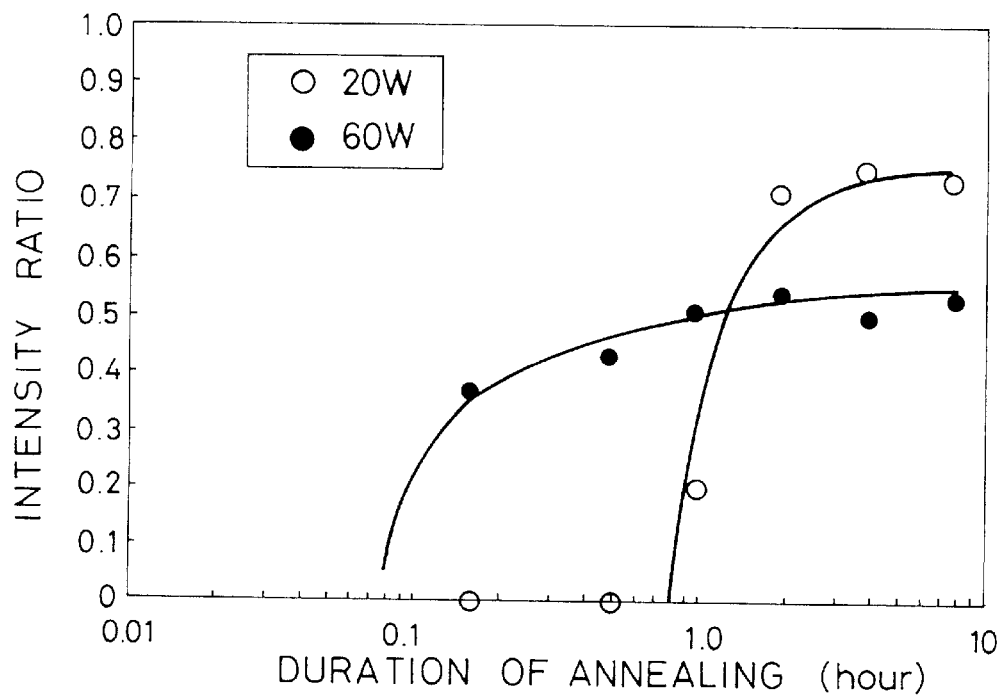
FIG. 6 shows the change of Raman scattering intensity ratio with the duration of annealing observed on a silicon film obtained in Example 1, in which the intensity ratio signifies the relative intensity taking the Raman scattering intensity of a standard sample (single crystal silicon) as unity.
Figure 7:
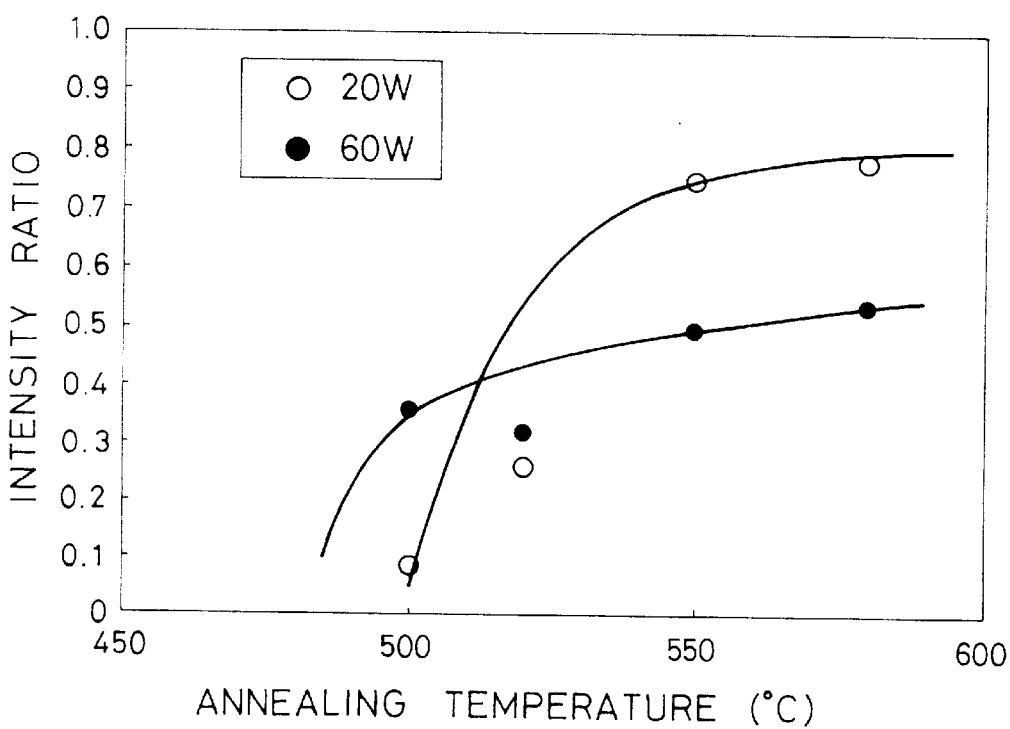
FIG. 7 shows the change of Raman scattering intensity ratio with changing temperature of annealing observed on a silicon film obtained in Example 1, in which the intensity ratio signifies the relative intensity taking the Raman scattering intensity of a standard sample (single crystal silicon) as unity.
Figure 8A:
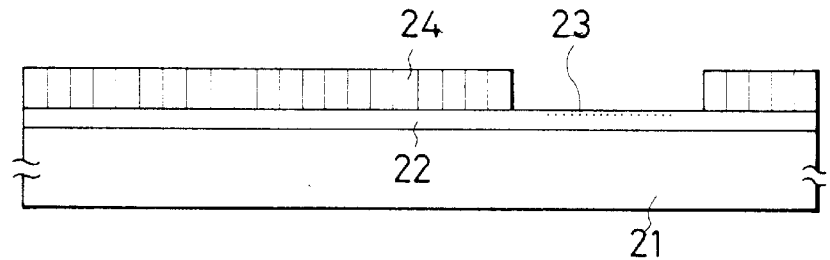
FIGS. 8(A) to 8(D) show schematically drawn step sequential cross section structures obtained in still another process for fabricating a TFT according to an embodiment of the present invention (Example 8)
Figure 8B:
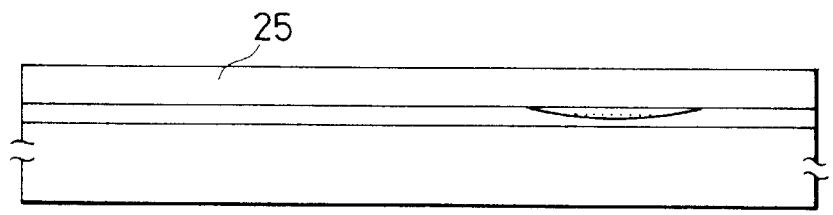
Figure 8C:
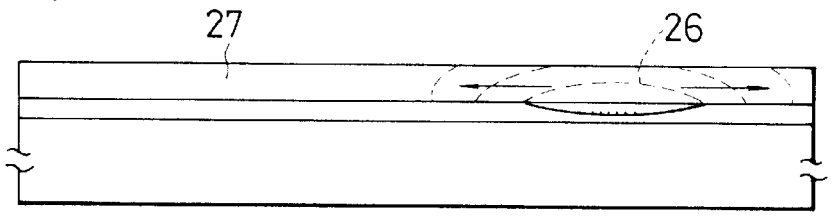
Figure 8D:
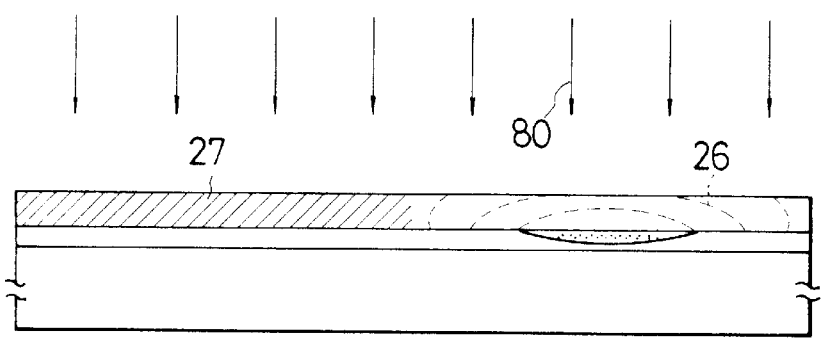

After allowing the amorphous silicon film to undergo solid phase crystal growth, the degree of crystallization thereof was evaluated using $Ar^+$-laser Raman spectroscopy. The results are shown in FIGS. 6 and 7. The ordinate in both of the graphs represents relative intensity taking the Raman peak intensity of a standard sample (a single crystal silicon) as unity. It can be read from the graphs that no crystallization occurs by heat treating a sample without plasma treatment at 580° C. or lower for a duration of 8 hours or less. In contrast to this, both of the samples plasma-treated at an RF power of 20 W and 60 W are found to undergo crystallization.

With a careful inspection of the results, it can be seen that the crystallization proceeds as a function of the RF power applied at the plasma treatment. More specifically, the crystallization proceeds rather sluggishly when plasma treatment is performed under a lower power of 20 W. At least an annealing for a duration of 1 hour is necessary to crystallize the amorphous silicon film at 550° C. In other words, the latent period in this case is 1 hour. However, after the passage of an hour, the crystallization proceeds swiftly to attain a saturated state within 2 hours of annealing. By comparing the Raman peak intensity, it can be seen that a crystallization degree well comparable to that of a standard sample, i.e., a single crystal silicon, is achieved for the sample after the annealing of 2 hours.

In contrast to the case above, crystallization proceeds relatively swiftly in the case a high RF power of 60 W is applied at the plasma treatment. For example, an annealing for 4 hours allows the amorphous silicon film to crystallize at a temperature as low as 480° C. and by increasing the temperature to 550° C., an annealing for a duration of mere 10 minutes (i.e., a latent period of 10 minutes) initiates crystallization and achieves a saturated state in an hour. However, the degree of crystallization is low, and by comparing the Raman intensity, it can be seen that the degree of crystallization achieve in this case only corresponds to less than 70% of that obtained for a silicon film crystallized under a lower power of 20 W.

This difference can be explained in terms of the nucleation density. That is, nuclei generate at a low density when the plasma treatment is applied under a low power condition, because the concentration of the catalytic substance is low. Thus, the crystallization of these nuclei requires a treatment at a high temperature and a long duration. However, the resulting crystallites have high crystallinity and yield a high Raman intensity ratio. On the other hand, catalytic substances are generated at a high concentration by applying a plasma treatment under a condition of high power. Since nucleation occurs at high density, crystallization occurs relatively easily. However, the nuclei interfere each other during their growth, and the film which is obtained as a result has a poor crystallinity.

At any rate, the application of a plasma treatment enables crystallization to take place at a low temperature and within a short period of time as compared to the case with no plasma treatment. Obviously, the crystallization at a low temperature and in a short period of time is achieved by applying a plasma treatment. In the present example, the concentration of the catalytic substance was controlled by controlling the RF power, however, other factors, such as the pressure applied during the plasma treatment, the type and the component of gas, the temperature of the sample, and the duration of processing, are all important factors for controlling the concentration of the catalytic substance.

EXAMPLE 2

Figure 2A:
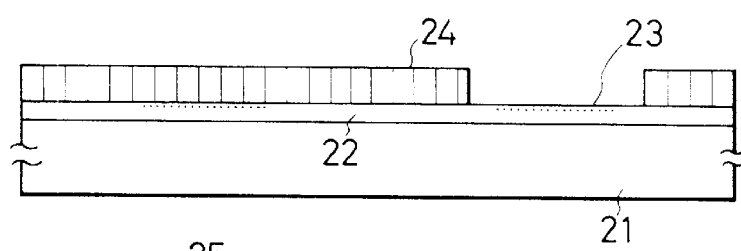
FIGS. 2(A) to 2(C) show schematically drawn step sequential cross section structures obtained in a process according to an embodiment of the present invention, in which selective crystallization is employed (Example 2)
Figure 2B:
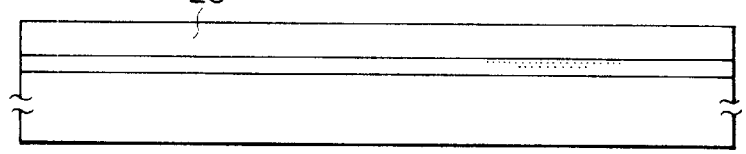
Figure 2C:
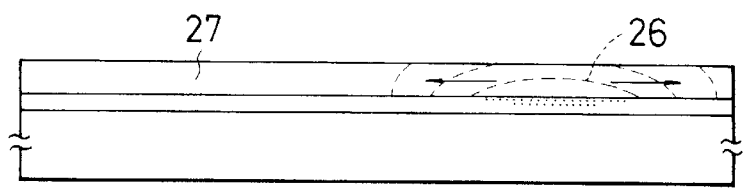

A process for selectively crystallizing an amorphous silicon film by selectively treating the oxide film base using a plasma treatment is described below. Referring to FIG. 2, a 2,000 Å thick silicon oxide film 22 was deposited as a base on a Corning #7059 substrate 21 by sputtering, and a heat-resistant photoresist 24 was applied thereon by spin-coating. After patterning the resulting photoresist film 24, the entire substrate was exposed to nitrogen plasma in the same manner as in Example 1 to perform plasma treatment on the exposed portion 23 of the oxide film base. The plasma treatment was effected under the same conditions as those employed in Example 1, except for setting the RF power to 60 W. Thus was obtained a structure shown in FIG. 2(A).

Since the substrate at this point is heated to a temperature of 200° C. or higher, the masking material to be used herein must at least resist to the same temperature. Furthermore, preferably, the masking material is removable without using a plasma. Thus, the use of a heat-resistant photoresist for the mask is preferred from these points of view. Otherwise, inorganic materials such as titanium nitride, silicon oxide, and silicon nitride can be used as well.

Subsequently, an annealing at 550° C. for a duration of 4 hours is performed after depositing a 1,500 Å thick amorphous silicon film 25 by low pressure CVD. As a result, crystalline silicon 26 was observed to form around the portions remained uncovered by the masking material on plasma treatment. The crystallization extended into portions covered by the masking material (but only portions treated by the plasma) for about 5 $\mu$m along the longitudinal direction. No crystallization was observed to occur on other portions 27 covered by the masking material. The annealing may be carried out by irradiating a laser light thereto before or after or at the same time as heating at 550° C. as described above.

Noticeably, the crystallinity for the portions subjected to plasma treatment were lower than that of the peripheral portions at a distance of 5 $\mu$m from those plasma-treated portions. In the portions directly subjected to plasma treatment, the fact is that the crystallites initiate growth from a plurality of independent nuclei, and that then they collide with each other to interfere their growth. On the other hand, the peripheral portions contain no nucleus, and the direction of crystal growth is confined to a single direction. It can be seen that the crystal growth is allowed to take place without any limitations.

EXAMPLE 3

A process for fabricating a TFT having particularly high mobility by selectively performing a plasma treatment is described below. More specifically, the masking material was formed only on a portion for fabricating a channel forming region (i.e., a region located under the gate contact and between a source and a drain in an island-like semiconductor region) of a TFT to prevent this portion from being exposed to plasma. However, since crystallization proceeds, though depending on the annealing temperature and duration, in a region from several micrometers to ten micrometers in size as described in the foregoing EXAMPLE 2, this process is not suitable for a device having too long a channel length and too wide a channel width.

In the plasma treatment, the surface of the silicon oxide base is subject to defects due to the impact exerted by the plasma. Moreover, various types of foreign matter adhere to the surface. A part of these defects and foreign matter functions as a catalyst to accelerate nucleation, however, it also may cause leak current if it is found in the channel forming region of a TFT. Furthermore, a TFT having high mobility can be obtained only by using semiconductors of high crystallinity. Thus, by referring to EXAMPLE 2 above, the peripheral portions are preferred to the plasma treated portions in this case.

Referring to FIG. 3, the process according to the present example is described below. A 2,000 Å thick silicon oxide film 31 was deposited as a base on a Corning #7059 substrate 30 by sputtering, and a heat-resistant photoresist was applied thereon to form masks 32A and 32B each at the same size as the channel, i.e., 5 $\mu$m×15 $\mu$m. Otherwise, the mask can be patterned using the patterning for the gate connection, because, as described hereinafter, the effect is the same for both considering that the crystallization is effected after patterning the amorphous silicon film. The resulting substrate was placed into a plasma 33 to perform the plasma treatment as shown in FIG. 3(A). The same plasma treating apparatus as that used in EXAMPLE 1 was used. The plasma treatment was performed for a duration of 5 minutes by applying an RF power of 60 W under a reaction pressure of 10 Pa (where, a vacuum degree of $10^{-3}$ Pa or lower is achieved), while flowing nitrogen as the reactive gas at a flow rate of 100 SCCM (standard cubic centimeters per minute) and maintaining the substrate temperature to 200° C.

Figure 3A:
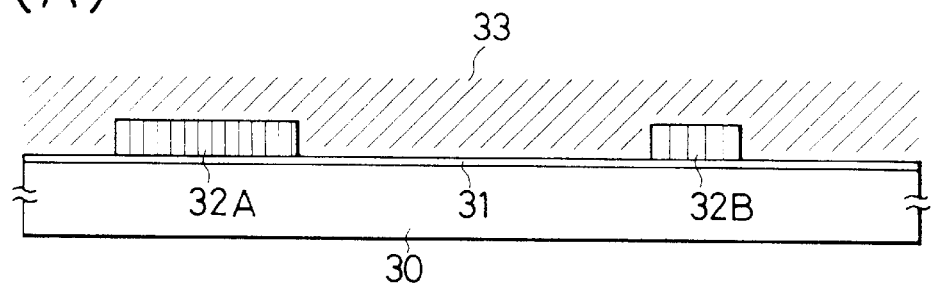
FIGS. 3(A) to 3(E) show schematically drawn step sequential cross section structures obtained in a process for fabricating a TFT according to an embodiment of the present invention (Example 3)
Figure 3B:
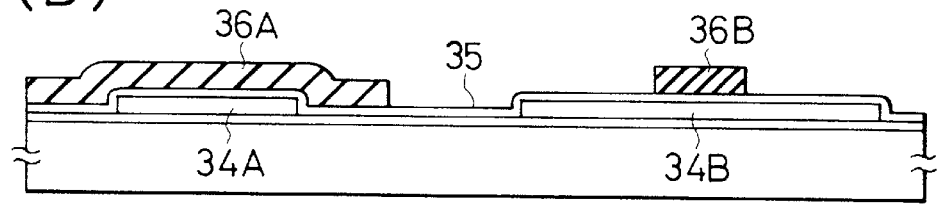

The masks 32A and 32B were removed after the plasma treatment, and a 1,500 Å thick amorphous silicon film was deposited thereon by low pressure CVD using monosilane ($SiH_4$) as the material gas. Subsequently, annealing was effected at 550° C. for a duration of 4 hours to allow the film to crystallize. A laser light may be irradiated to the film for crystallization of the film before or after or at the same time as the annealing. The thus crystallized film was patterned to form island-like silicon regions 34A and 34B, and this was followed by the deposition of a 1,000 Å thick silicon oxide film 35 by plasma CVD using tetraethoxysilane (TEOS) and oxygen as the material gases. After depositing an N-type polysilicon film by low pressure CVD, the resulting structure was subjected to patterning to form a gate connection with gate contact 36A and 36B. The resulting structure is shown in FIG. 3(B).

Figure 3C:
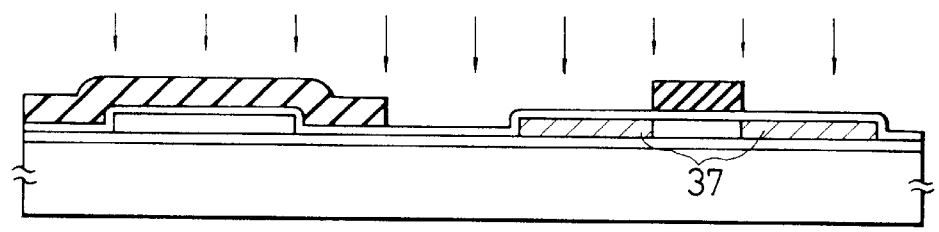

Then, impurities were introduced using plasma doping. In this case, phosphine ($PH_3$) gas and diborane ($B_2H_6$) gas were used as the N-type and P-type impurity sources, respectively. Phosphine was doped by applying an accelerating voltage of 80 keV, and diborane was doped under a voltage of 65 keV. The impurity region 37 was formed by further annealing the structure at 550° C. for 4 hours to activate the impurities. The activation of the impurities can be performed by a method using an optical energy, such as laser annealing and flash lamp annealing. The resulting structure is shown in FIG. 3(C).

Figure 3D:
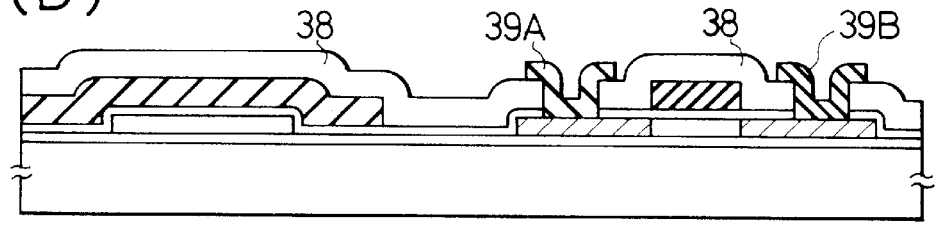

Finally, a 5,000 Å thick silicon oxide film was deposited as an interlayer insulator 38 in the same manner as in an ordinary process for fabricating a TFT. By forming contact holes in the resulting silicon oxide film, connection and contacts 39A and 39B were formed in the source region and the drain region. Thus was obtained the final structure of the TFT as shown in FIG. 3(D).

Figure 3E:
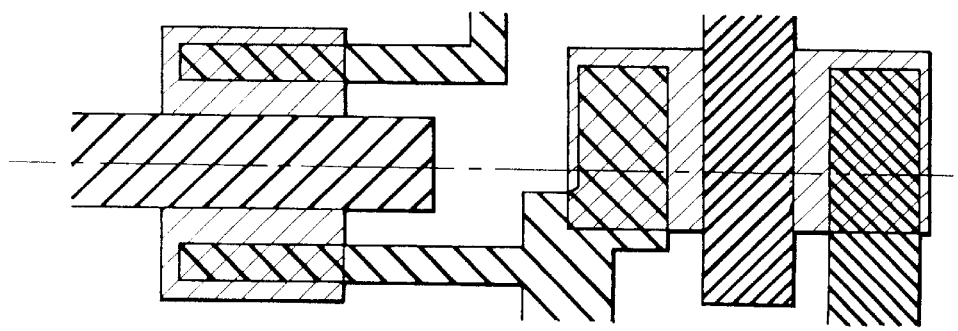

The final structure of the TFT circuit as viewed from the upper side is given in FIG. 3(E). The cross section views in FIGS. 3(A) to 3(D) are taken along the dashed line drawn in FIG. 3(E). The TFT thus obtained was found to have a field-effect mobility of from 40 to 60 $cm^2/Vs$ in the N-channel type, and of from 30 to 50 $cm^2/Vs$ in the P-channel type.

EXAMPLE 4

A process for fabricating an aluminum-gate TFT according to the present invention is described below.

Figure 4A:
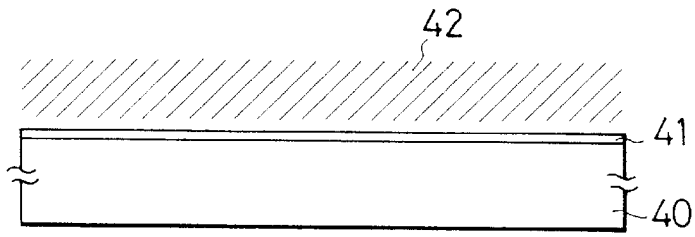
FIGS. 4(A) to 4(F) show schematically drawn step sequential cross section structures obtained in another process for fabricating a TFT according to an embodiment of the present invention (Example 3)

Referring to FIG. 4, a 2,000 Å thick silicon oxide film 41 was deposited as a base on a Corning #7059 substrate 40 by sputtering, and the entire substrate was exposed to plasma 42 as shown in FIG. 4(A) to effect the plasma treatment. The same plasma treatment apparatus as that used in EXAMPLE 1 was employed. The plasma treatment was performed for a duration of 5 minutes by applying an RF power of 60 W under a reaction pressure of 10 Pa (where, a vacuum degree of $10^{-3}$ Pa or lower is achieved), while flowing argon as the reactive gas at a flow rate of 100 SCCM (standard cubic centimeters per minute) and maintaining the substrate temperature to 200° C.

Figure 4B:
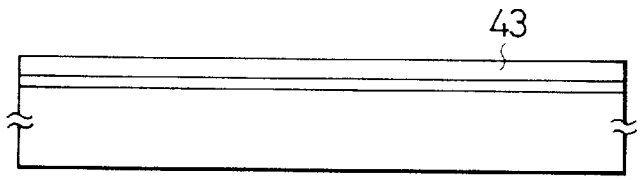

Then, a 1,500 Å thick amorphous silicon film 43 was deposited thereon by low pressure CVD using monosilane ($SiH_4$) as the material gas. Subsequently, annealing was effected at 550° C. for a duration of 4 hours to allow the film to crystallize. A laser light may be irradiated to the film for the crystallization of the film before or after or at the same time as the annealing. The resulting structure is shown in FIG. 4(B).

Figure 4C:
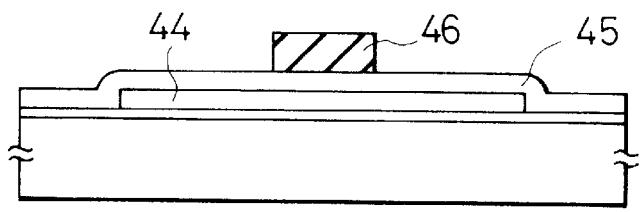

The thus crystallized film was patterned to form an island-like silicon region 44, and this was followed by the deposition of a 1,000 Å thick silicon oxide film 45 by plasma CVD using tetraethoxysilane (TEOS) and oxygen as the material gases. After depositing a 5,000 Å thick aluminum film containing 1% of silicon by sputtering, the aluminum film was patterned to form a gate connection and contact 46. The resulting structure is shown in FIG. 4(C).

Figure 4D:
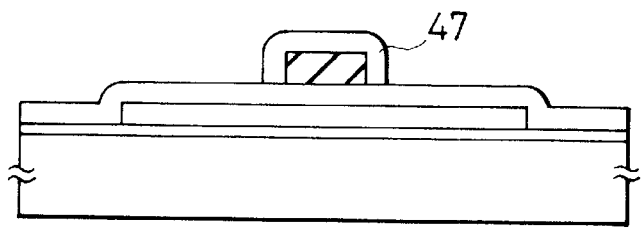

Subsequently, the entire substrate was subjected to anodic oxidation by dipping it into an ethylene glycol solution containing 3% of tartaric acid and applying current between a platinum cathode and the aluminum connection 46 (anode). The current was applied in such a manner that the voltage thereof would increase in the initial state at a rate of 2 V/minute, and that a constant voltage is maintained after a voltage of 220 V is attained. The current was turned off at the point the current dropped to 10 $\mu A/m^2$ or lower. Thus was obtained a 2,000 Å thick anodic oxide 47 as shown in FIG. 4(D).

Figure 4E:
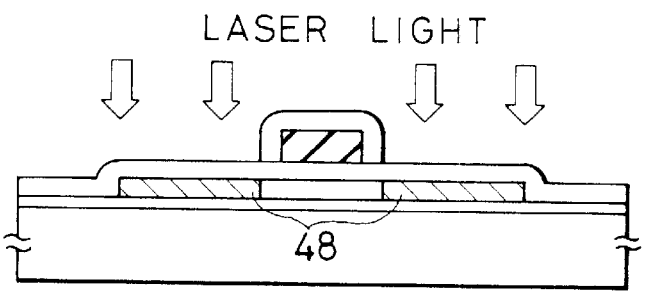

Then, impurities were introduced using plasma doping. In this case, phosphine ($PH_3$) gas and diborane ($B_2H_6$) gas were used as the N-type and P-type impurity sources, respectively. Phosphine was doped by applying an accelerating voltage of 80 keV, and diborane was doped under a voltage of 65 keV. The impurity region 48 was formed by further laser annealing the structure applying 5 shots using a KrF excimer laser operating at a wavelength of 248 nm and emitting a laser beam at an energy density of from 250 to 300 mJ/cm². The resulting structure is shown in FIG. 4(E).

Figure 4F:
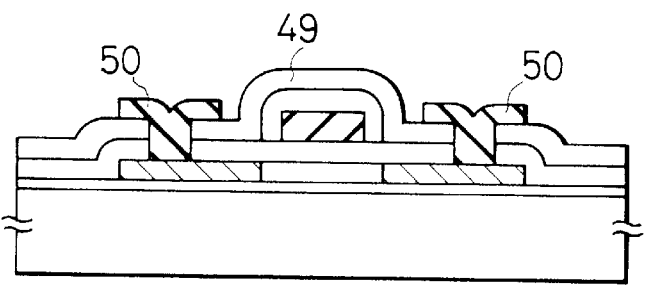

Finally, a 5,000 Å thick silicon oxide film was deposited as an interlayer insulator 49 in the same manner as in an ordinary process for fabricating a TFT. By forming contact holes in the resulting silicon oxide film, connection and contacts 50A and 50B were formed in the source region and the drain region. Thus was obtained the final structure of the TFT as shown in FIG. 4(F).

The TFT thus obtained was found to have a field-effect mobility of from 40 to 60 cm²/Vs in the N-channel type, and of from 30 to 50 cm²/Vs in the P-channel type. Furthermore, a shift resistor fabricated using this TFT was observed to operate at 6 MHz with a drain voltage of 17 V, and at 11 MHz with a drain voltage of 20 V.

EXAMPLE 5

A process which comprises selectively crystallizing an amorphous silicon film by selectively treating the oxide film base using a plasma treatment, and further enhancing the crystallization by irradiating a laser light is described below. The present example comprises a treatment using laser irradiation in addition to the process described in EXAMPLE 2.

Referring to FIG. 8, a 2,000 Å thick silicon oxide film 22 was deposited as a base on a Corning #7059 substrate 21 by sputtering, and a heat-resistant photoresist 24 was applied thereon by spin-coating. After patterning the resulting photoresist film 24, the entire substrate was exposed to nitrogen plasma in the same manner as in Example 1 to perform plasma treatment on the exposed portion 23 of the oxide film base. The plasma treatment was effected under the same conditions as those employed in Example 1, except for setting the RF power to 20 W. Thus was obtained a structure shown in FIG. 8(A).

Since the substrate at this point is heated to a temperature of 200° C. or higher, the masking material to be used herein must at least resist to the same temperature. Furthermore, preferably, the masking material is removable without using a plasma. Thus, the use of a heat-resistant photoresist for the mask is preferred from these points of view. Otherwise, inorganic materials such as titanium nitride, silicon oxide, and silicon nitride can be used as well.

Then, the photoresist 24 was removed.

Subsequently, an annealing at 550° C. for a duration of 4 hours is performed after depositing a 1,500 Å thick amorphous silicon film 25 by reduced pressure CVD. As a result, crystalline silicon 26 was observed to form around the portions remained uncovered by the masking material on plasma treatment. The crystallization extended into portions covered by the masking material (but only portions treated by the plasma) for about 5 $\mu m$ along the longitudinal direction. No crystallization was observed to occur on other portions 27 covered by the masking material.

After the thermal annealing above, a laser beam 80 was irradiated to the resulting structure. The laser annealing was performed by irradiating 2 shots using a KrF excimer laser operating at a wavelength of 248 nm and a pulse width of 20 nsec, and emitting a laser beam at an energy density of from 200 to 400 mJ/cm². During the laser annealing, the temperature of the substrate was maintained in the temperature range of from 150° to 300° C., for instance, at 200° C. by heating, to make the best of the effect exerted by laser irradiation.

Other usable laser light include those emitted from a XeCl excimer laser operating at a wavelength of 308 nm and an ArF excimer laser operating at a wavelength of 193 nm. Otherwise, an intense light may be irradiated in the place of a laser light. In particular, the application of RTA (rapid thermal annealing) which comprises irradiating an infrared light is effective because it can selectively heat the silicon film in a short period of time. A silicon film having a favorable crystallinity can be obtained by employing any of the aforementioned methods. Thus, the crystallized region 26 obtained as a result of thermal annealing was found to change into a silicon film 26' having a further improved crystallinity. A polycrystalline film 27' was obtained from the region remained uncrystallized 27 as a result of laser irradiation. This film 27', though apparently modified, was confirmed to have poor crystallinity by Raman spectroscopy. Furthermore, observation by transmission electron microscope revealed that numerous minute crystallites constitute the film 27', and that grain-oriented relatively large crystallites constitute the film 26'.

The resulting crystallized silicon film 26' was processed into island-like portions in the same manner as in EXAMPLE 3 (see FIG. 3) to obtain a TFT with considerably improved characteristics. More specifically, an N-channel TFT fabricated using the silicon film obtained in the present example yielded a field-effect mobility in the range of from 150 to 200 cm$^2$/Vs and a threshold voltage of from 0.5 to 1.5 V, which are in clear contrast with the values obtained on a previously obtained TFT using the silicon film obtained in EXAMPLE 2, namely, a mobility in the range of from 50 to 90 cm$^2$/Vs and a threshold value of 3 to 8 V. It can be seen that the mobility is greatly increased, and that the fluctuation in the threshold voltage is considerably decreased.

Conventionally, the above improvements in characteristics were only achievable by laser crystallization of the amorphous silicon film. The silicon films which were obtained by a prior art process by laser crystallization, however, had considerable fluctuation in the film characteristics. Moreover, they could not be fabricated by mass production because the crystallization thereof required a temperature of 400° C. or higher and an irradiation of a laser beam at an energy density of 350 mJ/cm$^2$ or higher. In contrast to a prior art process, the process according to the present example can be performed at a substrate temperature lower than the conventional one and by irradiating a laser beam at a far lower energy density. Furthermore, films of uniform quality can be obtained by the process according to the present invention at a yield well comparable to those fabricated by solid phase growth crystallization according to a conventional thermal annealing process. Thus, the TFTs fabricated therefrom also exhibited uniform characteristics.

It was found in the present invention that, when the concentration of nickel is low, the crystallization of silicon film occurs insufficiently. Accordingly, TFTs with poor characteristics result by using such silicon films. However, the process according to the present example provides a silicon film whose insufficient crystallinity is compensated by the effect of laser irradiation. Accordingly, silicon films containing a nickel at a low concentration were also made usable in TFTs by the process of the present example without impairing the characteristics of the resulting TFT. Thus, devices containing less nickel in the active layer region, i.e., those more favorable from the view point of electric stability and reliability, could be implemented.

EXAMPLE 6

The present example provides a process for introducing a catalytic element into the amorphous silicon film by coating the upper surface of the amorphous film with a solution prepared by introducing a catalytic element which accelerates the crystallization.

In the present example, the catalytic element is selectively introduced to allow the crystallites in this region to grow into the portions remained free from the catalytic elements. In this manner, crystalline silicon film can be obtained without increasing the concentration of the catalytic element.

Referring to FIG. 9, a silicon oxide film 902 was deposited on a Corning #7059 substrate 901 (10 cm$^2$ in size) by sputtering or by plasma CVD. Then, after depositing a 1,000 Å thick amorphous silicon film by plasma CVD, a 500 Å thick silicon oxide film 905 was deposited by sputtering to provide a protective coating. To this structure was dropped 5 ml (for a 10-cm$^2$ square substrate) of an acetate solution added therein 100 ppm by weight of nickel. A spinner 900 was operated at 50 rpm for a duration of 10 seconds to effect spin coating, thereby forming a uniform aqueous film 907 over the entire surface of the substrate. Furthermore, after maintaining the coated state for 5 minutes, the resulting structure was subjected to 60 seconds of spin drying by operating the spinner 900 at a rate of 2,000 rpm. The retention above may be otherwise conducted by applying a spinner rotating at 150 rpm or lower. Thus is obtained a structure shown in FIG. 9(A).

Subsequently, the amorphous silicon film 904 was crystallized by heating it at 550° C. under a nitrogen atmosphere for a duration of 8 hours. The crystal growth takes place during the heat treatment in such a manner that the crystals grow transversely along a direction indicated with an arrow 916, from a region 906 into which nickel was introduced to a region 903 free from the incorporation of nickel. As a matter of course, crystallization occurs also in the region 904 into which nickel was introduced directly.

Figure 9A:
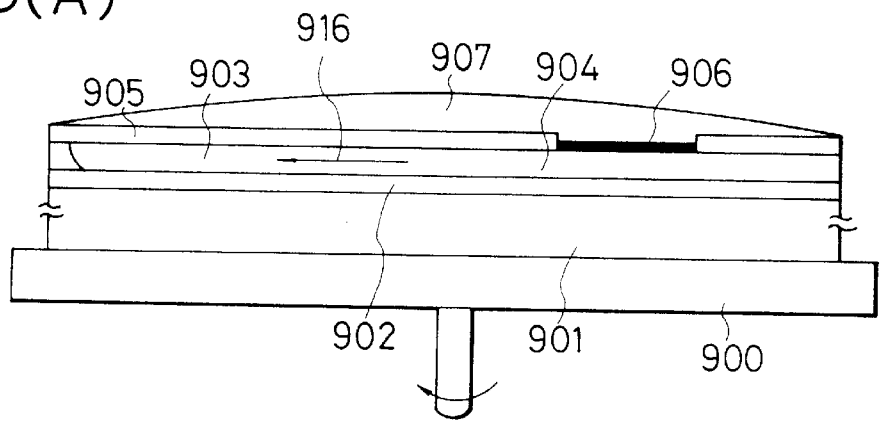
FIGS. 9(A) to 9(E) show schematically drawn step sequential cross section structures obtained in yet another process for fabricating a TFT according to an embodiment of the present invention (Example 9)
Figure 10:
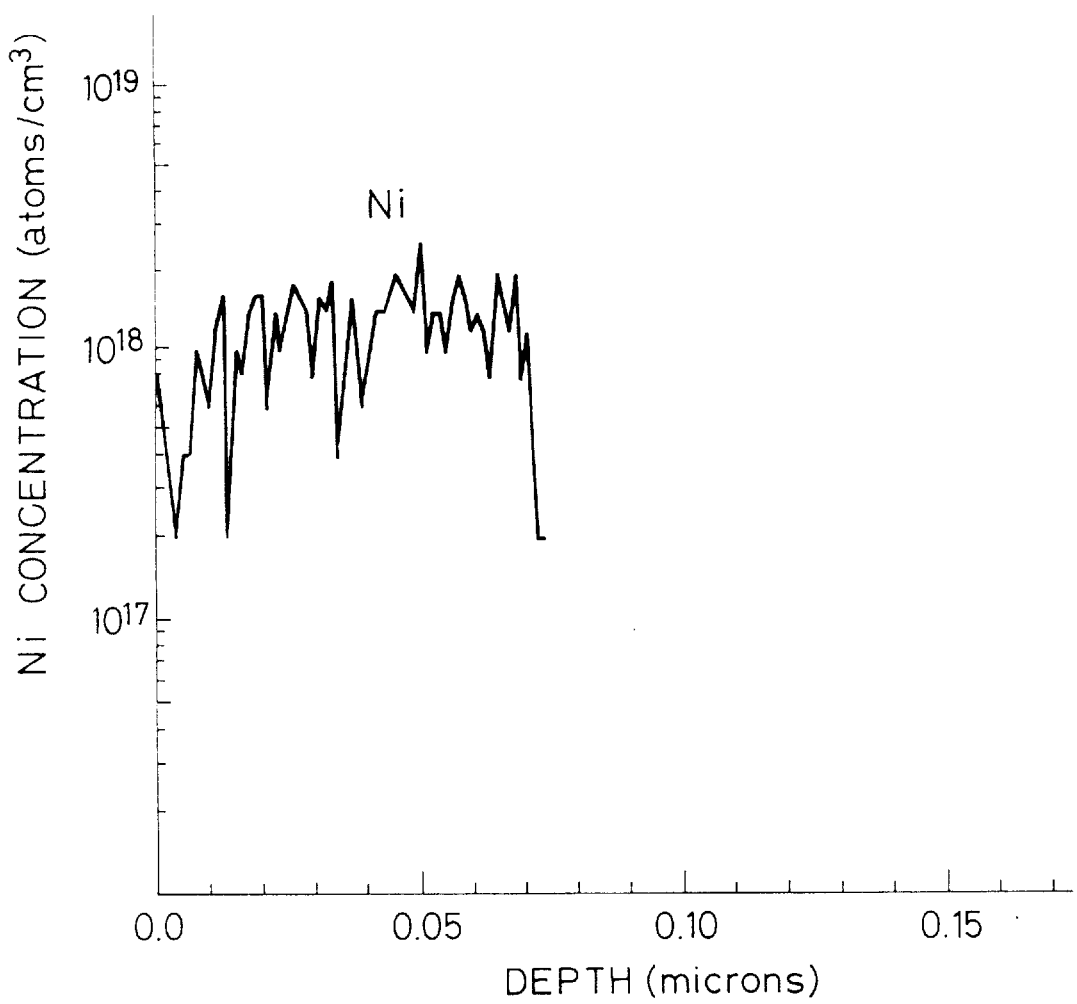
FIG. 10 shows the nickel concentration in silicon crystal.

Referring to FIG. 9(A), the crystallization occurs on the region 904 into which nickel had been directly introduced, and also on the region 903 in which the crystallization proceeds along a transverse direction. The concentration distribution for nickel in the region 903 is illustrated in FIG. 10. The distribution curve in FIG. 10 is based on the data of nickel concentration obtained by SIMS (secondary ion mass spectroscopy). It is confirmed that the nickel concentration in the region 904 into which nickel had been directly introduced is about a digit or more higher than the concentration shown in the graph of FIG. 10.

The nickel concentration distribution illustrated in the graph of FIG. 10 can be controlled by controlling the nickel concentration of the solution. In the present invention, the nickel concentration of the solution was adjusted to 100 ppm. However, it is known that crystallization also occurs even if the concentration of the solution is set to 10 ppm. The nickel concentration in the region 903 in FIG. 9 can be further lowered by a digit by setting the nickel concentration of the solution to 10 ppm. However, a problem newly arises by decreasing the nickel concentration of the solution, because the distance 916 of crystal growth along the transverse direction is shortened.

Furthermore, it is also effective to further improve the crystallinity of the crystalline silicon film thus obtained by irradiating a laser beam or an intense light equivalent thereto in the similar manner as in EXAMPLE 5. In the case of Example 5, however, the morphology of the film was impaired because, due to nickel included at a relatively high concentration, nickel precipitated from the silicon film to form grains of nickel silicide from about 0.1 to 10 μm in size in the silicon film. In contrast to the case of EXAMPLE 5 using plasma treatment to incorporate nickel inside the film, the nickel concentration can be far lowered in the present case. Accordingly, no precipitation of nickel silicide is found to form, and surface roughening of the film due to laser irradiation can be prevented from occurring.

The crystalline silicon film thus subjected to crystallization can be used directly in the active layer of a TFT. In particular, the use of the region 903 as the active layer of a TFT is extremely useful because of this region contain catalytic elements at a very low concentration.

Figure 9B:
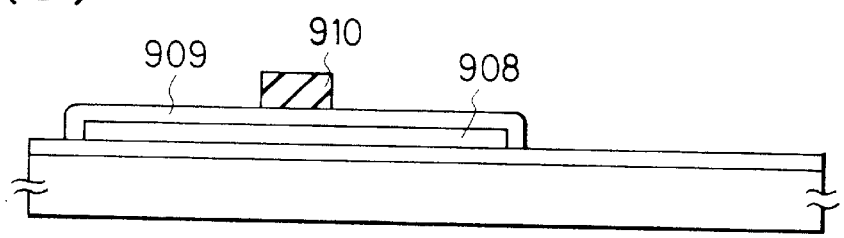

More specifically, the process for fabricating a TFT using the crystalline silicon film above comprises, as shown in FIG. 9(B) and the subsequent figures, etching the silicon film into an island-like portion to form an island-like silicon region 908. After etching the protective oxide film 905 the resulting structure is subjected to an oxidizing atmosphere in the temperature range of from 500° to 750° C., preferably in the range of from 550° to 650° C., to form a silicon oxide film 909 which functions as a gate insulator film on the surface of the silicon region. In this step of heat treatment, the oxidizing reaction can be further accelerated by incorporating water vapor, nitrous oxide, and the like into the atmosphere. As a matter of course, a known vapor phase growth process such as plasma CVD and sputtering can be used as an alternative means for forming the silicon oxide film 909, instead of performing the aforementioned thermal oxidation step.

After thus forming an island-like silicon region 908 and a silicon oxide film 909, a connection 910 which functions as a gate contact is formed using a material capable of being anodically oxidized, such as aluminum, is formed in such a manner that it may transverse the island-like silicon region. Preferably, aluminum containing from 0.05 to 0.3% by weight of scandium is used herein to prevent hillock from occurring. Thus, the structure shown in FIG. 9(B) is obtained.

Figure 9C:
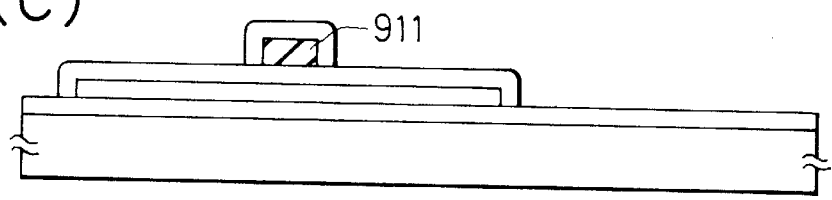

In the same manner as in EXAMPLE 4, the surface of the connection 910 was anodically oxidized to form a 0.1 to 1 μm thick anodically oxidized film 911 on the surface thereof. The resulting structure is shown in FIG. 9(C).

Figure 9D:
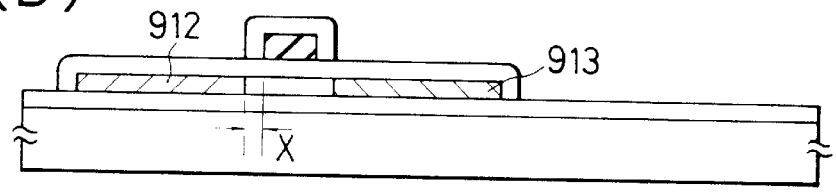

Then, an impurity was introduced into the structure using plasma doping. In this case, phosphine ($PH_3$) gas was used as the doping gas. Phosphine was doped at an accelerating voltage of 80 keV, and the thus doped impurity was activated by further laser annealing the structure applying 5 shots of laser using a KrF eximer laser operating at a wavelength of 248 nm and emitting a laser beam at an energy density of from 250 to 300 $mJ/cm^2$. Thus were formed the impurity regions 912 and 913. In this case, the gate contact is offset from the impurity region by a distance corresponding to the thickness x of the anodic oxide. The resulting structure is shown in FIG. 9(D).

Figure 9E:
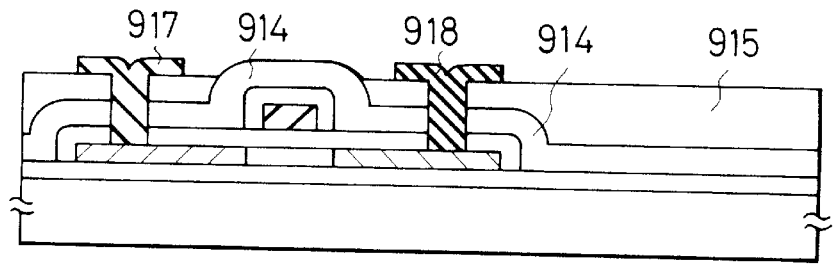

Finally, a 5,000 Å thick silicon oxide film was deposited as an interlayer insulator 914 in the same manner as in an ordinary process for fabricating a TFT. Additionally, a light-transmitting polyimide film 915 was formed by spin coating to form a further smoother surface. By forming contact holes in the resulting film, connection and contacts 917 and 918 were formed in the source region and the drain region. Thus was obtained the final structure of the TFT as shown in FIG. 9(E).

In the present example, an acetate solution was used as the solution containing the catalytic element. However, an aqueous solution, a solution based on an organic solvent, etc., which is selected from a wide variety, can be used as well. The catalytic element may not be included in the solution as a compound, and it may be simply dispersed in the solution.

The catalytic element can be incorporated into a solvent selected from polar solvents, for example, water, an alcohol, an acid, and ammonia.

When nickel is selected as the catalytic element, nickel is incorporated into a polar solvent by using a nickel compound. The nickel compounds to be used for this purpose include, representatively, nickel bromide, nickel acetate, nickel oxalate, nickel carbonate, nickel chloride, nickel iodide, nickel nitrate, nickel sulfate, nickel formate, nickel acetylacetate, nickel 4-cyclohexylbutyrate, nickel oxide, and nickel hydroxide.

Solvents to be used in the present invention include a non-polar solvent such as benzene, toluene, xylene, carbon tetrachloride, chloroform, and ethers.

In using a solvent, nickel is introduced in the form of a nickel compound. The nickel compounds to be used for this purpose include nickel acetylacetate and nickel 2-ethylhexanate.

It is also useful to incorporate a surfactant in the solution containing the catalytic element. The incorporation increases the adhesion strength of the solution to the coating surface and controls the adsorptivity. Otherwise, the surfactant may be previously applied to the surface to be coated with the solution. When metallic nickel is used as the catalytic element. It must be previously dissolved in an acid to use it in the form of a solution thereof.

The foregoing cases refer to examples using a solution into which the catalytic element, nickel, is completely dissolved. Nickel need not be completely dissolved in the solution, and materials in an other form, for instance, an emulsion comprising a powder of metallic nickel or a powder of a compound of nickel uniformly dispersed in a dispersion medium can be used as well.

The aforementioned facts also apply to any material using a catalytic element other than nickel.

A non-polar solution such as a toluene solution of nickel 2-ethylhexanate can be directly applied to the surface of an amorphous silicon film. In this case, it is also effective to previously coat the amorphous silicon film with an adhesive generally used in coating a resist. However, the use thereof must be done carefully, because the application thereof in too large an amount reversely interferes the addition of the catalytic element into the amorphous silicon film.

The catalytic element is incorporated into the solution approximately in an amount of, though depending on the type of the solution, from 1 to 200 ppm by weight, and preferably, from 1 to 50 ppm by weight. This range of addition is determined by taking the nickel concentration of the crystallized film and the resistance against hydrofluoric acid into consideration.

As described in the foregoing, the present invention is epoch-making in that it enables the crystallization of an amorphous silicon to take place at an even lower temperature and within a shorter period of time. Furthermore, the process according to the present invention is suitable for mass production, and yet, it can be performed employing the most commonly used equipments, apparatuses, and methods. Accordingly, it is a promising and a beneficial process for the electronic industry.

More specifically, for instance, a conventional solid phase growth process requires an annealing step for a duration of at least 24 hours. Considering that the process time per substrate is preferably 2 minutes, 15 annealing furnaces are necessary to make the process practically feasible. However, the present invention allows the process to complete within 8 hours, and under optimal conditions, the process can be even more shortened to a mere 4 hours or less. This signifies that the process can be performed while reducing the number of furnaces to only a sixth or less of the above calculated number. This leads to an increase of productivity and the cutting down of equipment investment, thereby lowering the process cost of the substrates. Accordingly, economical TFTs can be produced, and this might call novel demands. Conclusively, the present invention is greatly beneficial for the industry.

While the invention has been described in detail and with reference to specific embodiments thereof, it will be apparent to one skilled in the art that various changes and modifications can be made therein without departing from the spirit and scope thereof.

These are some methods to perform solid phase crystallization by using a metal catalyst. In using such metal catalyst elements, including Ni, Fe, Co, Ru, Rh, Pd, Os, Ir, Pt, Cu, Au, etc., the conventional method was physical formation such as sputtering method, electron beam evaporation method, etc.

In this case, a film including the catalyst of 5 to 200 Å in average thickness, e.g. 10 to 50 Å thick is formed in an island-form on a surface. That is, the catalyst element is dotted on the surface in the form of micrograins with an average diameter of 50 to 200 Å. The grain are separated from each other by approximately 100 to 1000 Å. In other words, it does not form a continuous film in any way, but forms a discontinuous film. Consequently, the metal islands form nuclei for crystallization. Crystals are grown from the nuclei in an amorphous silicon film on an insulating substrate by means of a thermal treatment at 450° C. to 600° C.

In the above conventional method, the crystallization temperature can be dropped by 50° to 100° C., in comparison to when such catalyst elements are not used for the crystallization. However, the following thing became clear as a result of observing the crystallized film carefully. A number of amorphous regions are left and that such regions have a metallic property. It is presumed that the metal catalyst is left as they are.

These metal regions form recombination centers of electrons and halls. Adding a reverse bias voltage to a semiconductor device, in particular, PI or NI junction because of the metal region existing in the junction region, it has quite inferior characteristics in that a leak current is increased. When thin-film transistors of channel length/channel width=8 $\mu$m/8 $\mu$m is formed with such a semiconductor layer, the Off-state current is $10^{-10}$ to $10^{-6}$ A, which is $10^2$ to $10^6$ times larger than $10^{12}$ although an OFF=-state current should be as small as about $10^{12}$ A.

The present invention aims at giving the chemical formation method which is quite different from above. In order to solve the problem above, it is a characteristic of the present invention to form a catalytic layer by using a solution (water, isopropyl alcohol, etc.) which contains a metal organic compound at a concentration 10 ppm to 100 ppm. For example, the following metal complex salt can be used as the metal compound. Namely, ferrous bromide ($FeBr_2$ $6H_2O$), ferric bromide ($FeBr_3$ $6H_2O$), ferric acetate (Fe $(C_2H_3O_2)_3$ $xH_2O$), ferrous chloride ($FeCl_2$ $4H_2O$), ferric chloride ($FeCl_3$ $6H_2O$), ferric fluoride ($FeF_3$ $3H_2O$), ferric nitrate ($Fe(NO_3)_3$ $9H_2O$), ferrous phosphate ($Fe_3(PO_4)_2$ $8H_2O$), ferric phosphate ($FePO_4$ $2H_2O$), cobalt bromide (CoBr $6H_2O$), cobalt acetate ($Co(C_2H_3O_2)_2$ $4H_2O$), cobalt chloride ($CoCl_2$ $6H_2O$), cobalt fluoride ($CoF_2$ $xH_2O$), cobalt nitrate ($Co(NO_3)_2$ $6H_2O$), ruthenium chloride ($RuCl_3$ $H_2O$), rhodium chloride ($RhCl_3$ $3H_2O$), palladium chloride ($PdCl_2$ $2H_2O$), osmium chloride ($OsCl_3$), iridium trichloride ($IrCl_3$ $3H_2O$), iridium tetrachloride ($IrCl_4$), platinic chloride ($PtCl_4$ $5H_2O$), cupric acetate ($Cu(CH_3COO)_2$), cupric chloride ($CuCl_2$ $2H_2O$), cupric nitrate ($Cu(NO_3)_2$ $3H_2O$), auric trichloride ($AuCl_3$ $xH_2O$), auric chloride ($AuHCl_4$ $4H_2O$), sodium auric tetrachloride ($AuNaCl_4$ $2H_2O$).

The above materials can be dispersed in a solution in a monomolecular form. This solution can be spread on an entire surface of a substrate by spin coating in which the solution is dropped and then the substrate is rotated at a rotational speed of 50 to 500 r.p.m.

When a silicon oxide film of 5 to 100 Å thick is formed on the surface of a silicon semiconductor in order to improve a wettability of the silicon surface with respect to the solution, this thin film can prevent the solution from becoming spot condition by the surface tension of liquid. It is also practicable to improve the wettability of semiconductor silicon without a silicon oxide film by adding a surface active agent into the solution.

In these methods, the metal catalyst atoms can be dispersed into semiconductor through the oxide film. In particular, it is possible to promote a crystallization without forming crystal nuclei in the form of grains. Therefore, it is a favorable method.

It is also useful to coat the organic metal uniformly and a UV treatment (ozone treatment) in oxygen is performed for formation of a metal oxide film. In this case, oxidized organic substance can be vaporized and removed as carbon dioxide, so it is possible to make the solid phase growth more uniform.

When the spin coating is carried out only at low rational speed, too much metal constituent for solid phase growths is apt to be supplied into the semiconductor film. Therefore, after the rotation at a low speed, the substance is rotated at 1000 to 10,000 r.p.m., e.g., 2000 to 5000 r.p.m. Thus, an excess organic metal can be eliminated from the surface of substrate and the surface can be dried sufficiently. Moreover, it is effective to control the amount of the organic metal to be formed on the surface. In the above chemical formation method, a continuous layer can be formed on a surface of semiconductor without forming nuclei of metal particles for crystallization.

A metal catalyst layer becomes inhomogeneous layer when it is formed by a physical formation method, on the other hand, it becomes homogeneous layer when it is formed by a chemical method as is the case in the present invention.

In accordance with the above new concept, the crystals can be grown far more uniformly on an entire surface of the semiconductor film when the crystallization is performed by thermal treatment which is performed at 450° C. to 650° C. Therefore, it is possible to form excellent P-I and N-I junctions by using the thus crystallized semiconductor film. In this case, the leak is controlled to be as small as $10^{-12}$ A even if a reverse bias voltage is applied.

In the case of a physical method, 90 to 100 out of 100 P-I junctions have a large leak current, that is $10^{-10}$ to $10^{-5}$ A and 50 to 70 out of 100 N-I junctions have $10^{-12}$ to $10^{-6}$ leak current. On the other hand, in the chemical method of the present invention, 5 to 20 out of 100 P-I junctions have a leak current as small as $10^{-13}$ to $10^{-8}$ A and 0 to 20 out of 100 N-I junctions have a leak current as small as $10^{-13}$ to $10^{-8}$ A. So, the present invention improves the characteristics quite remarkably because both an OFF-state current and the probability of a film that leak current is large are reduced.

Besides, the fine effect can be obtained in both P-channel TFTs (having a PIP junctions) and N-channel TFTs (having a NIN junctions) by forming the above semiconductor film on an insulating surface. Moreover, the present invention can reduce the probability by about 1 or 2 orders that TFTs having large leak current are formed. However, if the TFTs are used for making thin film IC, the probability which TFTs having large current are formed should be decreased $1/10^3$ to $1/10^9$.

In the present invention, after the thermal crystallization, a laser light having a wavelength 248 nm or 308 nm is irradiated on the surface of the semiconductor with the energy density being 250 to 400 mJ/cm². The absorption of light is larger in the region that metal constituent exist largely compared to the silicon region crystallized. That is, the region which remains an amorphous structure becomes black optically while the crystal constituent is transparent. Because of this, the slightly remaining amorphous component can be melted by the irradiation of the laser light selectively. Further, the metal existing in the amorphous component can be dispersed to an atomic level in this manner.

As a result, it was possible to reduce the possibility that the metal regions are formed within a recrystallized film, and it was possible to reduce the leak current of a TFT to $10^{-13}$ to $10^{-12}$ A, and further, when $10^4$ to $10^8$ pieces of TFTs were manufactural, only 1–3 of them had an undesirable large leak current. This is because the metal regions which form recombination centers and cause the increase in a leak current are removed from the semiconductor film.

By spin coating in the present method, the leak current of the reversed direction i.e. Ioff is reduced by two orders, and the probability which TFTs having a large leak current exist can be reduced by two orders. Nevertheless, TFTs having a large leak current are formed. Assumably, the cause of forming such defective TFTs is that dust adheres to the surface of the semiconductor, on which organic metal concentrates. The characteristic can be improved by the improvement of experimental equipment.

An experiment was conducted in which laser light was irradiated to a film which was obtained by forming a catalyst metal through a conventional physical formation method and heat crystallizing. In this case, however, an OFF current could not be reduced at all at P-I or N-I junctions when a reverse bias voltage was applied, even if the semiconductor is fused by the irradiation of laser light for recrystallization because metal grains in the starting film tend to be too big.

Accordingly, the method which utilizes a chemical formation method for forming a continuous layer of an organic metal catalyst is entirely different from the conventional method which utilizes a physical formation method followed by a thermal crystallization process. It is clearly understood that the chemical formation method is superior.

Instead of using a solution for forming the continuous catalyst layer, it is possible to utilize a CVD method with an organic metal gas as a starting material. The method is quite effective in order to reduce both an OFF current and the probability which TFTs having a large leak current exist. Further, the process of the present invention is a homogeneous crystal growth, that is, isotropic growth by using metal catalyst. On the other hand, the process of the conventional method is a non-uniform crystal growth, that is, a non-isotropic growth by using metal nuclei.

In the present invention, there are two ways as to how the crystal growth occurs; one is that the crystals are grown in the transverse direction with the surface of the substrate and the other is that the crystals are grown in the vertical direction with the surface of the substrate from the lower side of the semiconductor to the upper side thereof or vice versa. In either case, it is possible to obtain a semiconductor having an excellent electrical characteristics.

We claim:

1. A method of manufacturing a thin film transistor comprising an active layer having a channel region, comprising the steps of:
   disposing a semiconductor film comprising silicon in contact with a catalyst for promoting a crystallization of said semiconductor film;
   crystallizing said semiconductor film provided with said catalyst by heating;
   introducing phosphorus ions into a selected region of the crystallized film, said selected region excluding said channel region of said thin film transistor; and
   thermally annealing said crystallized film introduced with said phosphorus ions.

2. A method according to claim 1 wherein said semiconductor film is an amorphous silicon film.

3. A method according to claim 1 wherein said semiconductor film is intrinsic or substantially intrinsic.

4. A method according to claim 1 wherein the step of thermal annealing is conducted at a temperature of 550° C. for 4 hours.

5. A method according to claim 1 wherein said selected region comprises source and drain regions.

6. A method of manufacturing a thin film transistor comprising an active layer having a channel region, comprising the steps of:
   disposing a semiconductor film comprising silicon in contact with a metallic catalyst for promoting a crystallization of said semiconductor film;
   crystallizing said semiconductor film provided with said metallic catalyst by heating;
   introducing phosphorus into a selected region of said semiconductor film, said selected region excluding said channel region of said thin film transistor; and
   thermally annealing said crystallized film introduced with said phosphorus.

7. A method according to claim 6 wherein said semiconductor film is an amorphous silicon film.

8. A method according to claim 6 wherein said semiconductor film is intrinsic or substantially intrinsic.

9. A method according to claim 6 wherein said selected region comprises source and drain regions.

10. A method according to claim 6 wherein said metallic catalyst is selected from the group consisting of nickel, iron, and cobalt.

11. A method of manufacturing a thin film transistor comprising an active layer having source, drain, and channel regions, comprising the steps of:
    disposing a semiconductor film comprising silicon in contact with a catalyst for promoting a crystallization of said semiconductor film;
    crystallizing said semiconductor film provided with said catalyst by heating;
    introducing phosphorus ions into said source and drain regions of said crystallized film;
    thermally annealing said crystallized film to activate said phosphorus ions introduced therein.

12. A method according to claim 11 wherein said semiconductor film is an amorphous silicon film.

13. A method according to claim 11 wherein said semiconductor film is intrinsic or substantially intrinsic.

14. A method according to claim 11 wherein the step of thermal annealing is conducted using a flash lamp.

15. A method according to claim 12 wherein the step of thermal annealing is conducted at a temperature of 550° C. for 4 hours.

16. A method of manufacturing a thin film transistor comprising an active layer having source, drain, and channel regions, comprising the steps of:
    disposing a semiconductor film comprising silicon in contact with a metallic catalyst for promoting a crystallization of said semiconductor film;
    crystallizing said semiconductor film providing with said metallic catalyst by heating;
    introducing phosphorus into said source and drain regions of said crystallized film;
    thermally annealing said crystallized film to activate said phosphorus introduced therein.

17. A method according to claim 16 wherein said semiconductor film is an amorphous silicon film.

18. A method according to claim 16 wherein said semiconductor film is intrinsic or substantially intrinsic.

19. A method according to claim 16 wherein the step of thermal annealing is conducted at a temperature of 550° C. for 4 hours.

20. A method according to claim 16 wherein said metallic catalyst is selected from the group consisting of nickel, iron, and cobalt.

21. A method of manufacturing a semiconductor device comprising the steps of:
 disposing a semiconductor film comprising silicon in contact with a catalyst for promoting a crystallization of said semiconductor film;
 crystallizing said semiconductor film provided with said catalyst by heating;
 introducing phosphorus ions into a selected portion of the crystallized film; and
 thermally annealing the crystallized film to activate said phosphorus ions introduced therein.

22. A method according to claim 21 wherein said semiconductor film is an amorphous silicon film.

23. A method according to claim 21 wherein said semiconductor film is intrinsic or substantially intrinsic.

24. A method according to claim 21 wherein the step of thermal annealing is conducted at a temperature 550° C. for 4 hours.

25. A method according to claim 21 wherein said selected portion comprises source and drain regions of a thin film transistor.

26. A method of manufacturing a semiconductor device comprising the steps of:
 disposing a semiconductor film comprising silicon in contact with a metallic catalyst for promoting a crystallization of said semiconductor film;
 crystallizing said semiconductor film provided with said metallic catalyst by heating;
 introducing phosphorus into a selected portion of the crystallized film; and
 thermally annealing said crystallized film to activate said phosphorus introduced therein.

27. A method according to claim 26 wherein said semiconductor film is an amorphous silicon film.

28. A method according to claim 26 wherein said semiconductor film is intrinsic or substantially intrinsic.

29. A method according to claim 26 wherein said selected portion comprises source and drain regions of a thin film transistor.

30. A method according to claim 26 wherein said metallic catalyst is selected from the group consisting of nickel, iron, and cobalt.

31. A method of manufacturing a thin film transistor comprising an active layer having a channel region, comprising the steps of:
 selectively disposing a first portion of a semiconductor film comprising silicon in contact with a catalyst for promoting a crystallization of said semiconductor film;
 crystallizing said semiconductor film provided with said catalyst by heating wherein the crystallization proceeds horizontally from said first portion to a second portion adjacent thereto;
 introducing phosphorus ions into a selected region of the crystallized film, said selected region excluding said channel region; and
 thermally annealing said crystallized film introduced with said phosphorus ions.

32. A method according to claim 31 wherein said semiconductor film is an amorphous silicon film.

33. A method according to claim 31 wherein said semiconductor film is intrinsic or substantially intrinsic.

34. A method according to claim 31 wherein the step of thermal annealing is conducted at a temperature of 550° C. for 4 hours.

35. A method according to claim 31 wherein said selected region comprises source and drain regions.

36. A method of manufacturing a thin film transistor comprising an active layer having source, drain, and channel regions, comprising the steps of:
 selectively disposing a first portion of a semiconductor film comprising silicon in contact with a metallic catalyst for promoting a crystallization of said semiconductor film;
 crystallizing said semiconductor film provided with said metallic catalyst by heating wherein the crystallization proceeds horizontally from said first portion to a second portion adjacent thereto;
 introducing phosphorus into a selected region of the crystallized film, said selected region excluding said channel region; and
 thermally annealing said crystallized film introduced with said phosphorus.

37. A method according to claim 36 wherein said semiconductor film is an amorphous silicon film.

38. A method according to claim 36 wherein said semiconductor film is intrinsic or substantially intrinsic.

39. A method according to claim 36 wherein said selected region comprises said source and drain regions.

40. A method according to claim 36 wherein said metallic catalyst is selected from the group consisting of nickel, iron, and cobalt.

41. A method of manufacturing a thin film transistor comprising an active layer having source, drain, and channel regions, comprising the steps of:
 selectively disposing a first portion of a semiconductor film comprising silicon in contact with a catalyst for promoting a crystallization of said semiconductor film;
 crystallizing said semiconductor film provided with said catalyst by heating wherein the crystallization proceeds horizontally from said first portion to a second portion adjacent thereto;
 introducing phosphorus ions into said source and drain regions of said crystallized film;
 thermally annealing said crystallized film to activate said phosphorus ions introduced therein.

42. A method according to claim 41 wherein said semiconductor film is an amorphous silicon film.

43. A method according to claim 41 wherein said semiconductor film is intrinsic or substantially intrinsic.

44. A method according to claim 41 wherein the step of thermal annealing is conducted using a flash lamp.

45. A method according to claim 41 wherein the step of thermal annealing is conducted at a temperature of 550° C. for 4 hours.

46. A method of manufacturing a thin film transistor comprising an active layer having source, drain, and channel regions, comprising the steps of:
 selectively disposing a first portion of a semiconductor film comprising silicon in contact with a metallic catalyst for promoting a crystallization of said semiconductor film;
 crystallizing said semiconductor film provided with said metallic catalyst by heating wherein the crystallization proceeds horizontally from said first portion to a second portion adjacent thereto;
 introducing phosphorus into said source and drain regions of said crystallized film;
 thermally annealing said crystallized film to activate said phosphorus introduced therein.

47. A method according to claim 46 wherein said semiconductor film is an amorphous silicon film.

48. A method according to claim 46 wherein said semiconductor film is intrinsic or substantially intrinsic.

49. A method according to claim 46 wherein the step of thermal annealing said conducted using a flash lamp.

50. A method according to claim 46 wherein said metallic catalyst is selected from the group consisting of nickel, iron, and cobalt.

51. A method according to claim 46 wherein said semiconductor film is formed through a LPCVD method.

52. A method according to claim 46 wherein the step of thermal annealing is conducted at a temperature of 550° C.

53. A method according to claim 46 wherein said phosphorus is introduced by a plasma doping method.

54. A method according to claim 46 wherein further comprising a step of forming a gate electrode over said crystallized film.

55. A method according to claim 54 wherein said gate electrode comprises silicon.

56. A method according to claim 46 wherein said step of crystallizing is conduct at 550° C. or more.

57. A method according to claim 46 wherein said crystallized film contains carbon, oxygen, and nitrogen elements at $1\times10^{19}$ cm$^{-3}$ or less, respectively.

58. A method of manufacturing a semiconductor device comprising the steps of:

selectively disposing a first portion of a semiconductor film comprising silicon in contact with a catalyst for promoting a crystallization of said film;

crystallizing said film provided with said catalyst by heating wherein the crystallization proceeds horizontally from said first portion to a second portion adjacent thereto;

introducing phosphorus ions into a selected region of the crystallized film; and thermally annealing the crystallized film to activate said phosphorus ions introduced therein.

59. A method according to claim 58 wherein said semiconductor film is an amorphous silicon film.

60. A method according to claim 58 wherein said semiconductor film is intrinsic or substantially intrinsic.

61. A method according to claim 58 wherein the step of thermal annealing is conducted at a temperature of 550° C. for 4 hours.

62. A method according to claim 58 wherein said selected region comprises source and drain regions of a thin film transistor.

63. A method of manufacturing a semiconductor device comprising the steps of:

selectively disposing a first portion of a semiconductor film comprising silicon in contact with a metallic catalyst for promoting a crystallization of said semiconductor film;

crystallizing said semiconductor film provided with said metallic catalyst metal by heating wherein the crystallization proceeds horizontally from said first portion to a second portion adjacent thereto;

introducing phosphorus into a selected region of the crystallized film; and thermally annealing said crystallized film to activate said phosphorus introduced therein.

64. A method according to claim 63 wherein said semiconductor film is an amorphous silicon film.

65. A method according to claim 63 wherein said semiconductor film is intrinsic or substantially intrinsic.

66. A method according to claim 63 wherein said selected region comprises source and drain regions of a thin film transistor.

67. A method according to claim 63 wherein said metallic catalyst is selected from the group consisting of nickel, iron, and cobalt.

* * * * *